United States Patent
Pavio et al.

(10) Patent No.: US 6,377,125 B1
(45) Date of Patent: Apr. 23, 2002

(54) DISTRIBUTED AMPLIFIER HAVING SEPARATELY BIASED SECTIONS

(75) Inventors: Anthony M. Pavio, Paradise Valley; Lei Zhao, Chandler, both of AZ (US)

(73) Assignee: Motorola.Inc., Schaumburg, IL (US)

( * ) Notice: Subject to any disclaimer, the term of this patent is extended or adjusted under 35 U.S.C. 154(b) by 0 days.

(21) Appl. No.: 09/809,377

(22) Filed: Mar. 15, 2001

(51) Int. Cl.[7] .............................. H03F 3/60; H03F 3/68; H03F 3/04
(52) U.S. Cl. ..................... 330/286; 330/295; 330/296
(58) Field of Search ............................... 330/286, 295, 330/296

(56) References Cited

U.S. PATENT DOCUMENTS

| | | | | |
|---|---|---|---|---|
| 4,543,535 A | * | 9/1985 | Ayasli ........................ | 330/277 |
| 4,788,509 A | * | 11/1988 | Bahl et al. .................. | 330/286 |
| 5,012,203 A | | 4/1991 | Beyer et al. ................ | 330/286 |
| 5,021,743 A | * | 6/1991 | Chu et al. ................... | 330/277 |
| 5,365,197 A | | 11/1994 | Ikalainen .................... | 330/286 |
| 5,559,472 A | | 9/1996 | Kobayashi ................... | 330/293 |
| 5,604,673 A | | 2/1997 | Washburn et al. ......... | 363/147 |
| 5,880,640 A | | 3/1999 | Dueme ....................... | 330/303 |
| 5,920,230 A | | 7/1999 | Beall ........................... | 330/54 |
| 6,049,250 A | * | 4/2000 | Kintis et al. ................ | 330/286 |
| 6,160,469 A | | 12/2000 | Liberatore et al. ......... | 336/200 |

* cited by examiner

Primary Examiner—Robert Pascal
Assistant Examiner—Patricia T. Nguyen
(74) Attorney, Agent, or Firm—William E. Koch

(57) ABSTRACT

A distributed amplifier (40) and a method (100) of operating the distributed amplifier (40) are provided in accordance with the present invention. The distributed amplifier (40) comprises an input transmission line (48), an output transmission line (50) and N amplifier sections (42,44,46) having a transistor (52) connected to the input transmission line (48) and the output transmission line (50). The distributed amplifier (40) also comprises N independent biasing sources (82,84,86) configured to provide N independent biasing voltages for each transistor (52) of the N amplifier sections (42,44,46) for active operation, wherein the distributed amplifier (40) is configured such that when a first independent biasing voltage of said N independent biasing voltages is modified for a first transistor of a first section of the N amplifier sections, the first transistor of the first section of the N amplifier sections is configured for a non-active operation and an output power of the distributed amplifier (40) is reduced without a substantial degradation in an efficiency of the distributed amplifier (40).

34 Claims, 4 Drawing Sheets

DISTRIBUTED AMPLIFIER HAVING SEPARATELY BIASED SECTIONS

FIELD OF THE INVENTION

The present invention generally relates to electronic amplifiers, and more particularly to a method of operating a distributed amplifier having separately biased amplifier sections.

BACKGROUND OF THE INVENTION

Distributed amplifiers and mixers have been used extensively for many years in a variety of broadband system applications such as microwave receivers, wide-band transmitter exciters and low noise oscilloscope preamplifiers. Distributed amplifiers are conventionally configured to employ multiple amplifier cells within the distributed transmission line networks. The conventional configuration of multiple amplifier cells within the distributed transmission line networks generally exhibits the desired increase in gain. However, the efficiency of the conventional configuration of multiple amplifier cells within the distributed transmission line networks degrades with a reduction in drive power.

Referring to FIG. 1, a distributed amplifier 10 is illustrated according to the prior art. The distributed amplifier 10 is shown with multiple cells (12,14,16). Each of the cells (12,14,16) includes a field effect transistor (FET) 18. The drain terminal 20 of the FET 18 of each of the cells (12,14,16) are coupled with output-line inductances 22, which are connected to an output-line ground 24 with an output-line termination resistance 26. The gate terminals 28 of the first FET 18 of each of the cells (12,14,16) are coupled with input-line inductances 30 that are connected to an input-line ground 32 with an input-line termination resistance 34.

The distributed amplifier 10 of the prior art as illustrated in FIG. 1 has a lower output with a reduction in the drive power. However, the Direct Current (DC) power consumption is not substantially reduced so that the Power-Added Efficiency (PAE) of the distributed amplifier 10 of the prior art degrades as a function of the output power ($P_{out}$) An example of PAE degradation as a function of the output power ($P_{out}$) for a distributed amplifier of the prior art is illustrated in the graph of FIG. 2.

Distributed amplifiers of the prior art, such as the distributed amplifier 10 shown in FIG. 1, that are designed to operate from about two to twenty Giga-Hertz (GHz) (i.e., microwave amplifiers) have been fabricated on gallium arsenide (GaAs) substrates. These microwave amplifiers that are fabricated on GaAs substrates have circuit elements with relatively small values, which require minimal space on the GaAs substrate (e.g., inductors of one nH to two nH typically require an area of fifteen microns by fifteen microns). However, if the distributed amplifier is designed for frequencies below about three GHz, numerous circuit elements are used with values that require a larger space on the GaAs substrate than the circuit elements used for distributed amplifiers designed for frequencies greater than about ten GHz (e.g. an output-line inductances 24 of ten nH would generally require an area of sixty microns by sixty microns.) Therefore, the distributed amplifiers that are designed for frequencies below about ten GHz on GaAs substrates tend to utilize an undesirable amount of semiconductor material that reduces the cost effectiveness of such a device.

In view of the foregoing, it should be appreciated that it would be desirable to increase the cost effectiveness of a distributed amplifier and more preferably to increase the cost effectiveness of a distributed amplifier that is designed for frequencies below about twenty GHz, more preferably below ten GHz, even more preferably below about five GHz, and most preferably below about two GHz. In addition, it is desirable to provide a linear distributed amplifier with a PAE that is not substantially affected by a reduction in the drive power. Furthermore, additional desirable features will become apparent to one skilled in the art from the drawings, foregoing background of the invention and following detailed description of a preferred exemplary embodiment, and appended claims.

BRIEF DESCRIPTION OF THE DRAWINGS

The present invention will hereinafter be described in conjunction with the appended drawing figures, wherein like numerals denote like elements, and.

DETAILED DESCRIPTION OF A PREFERRED EXEMPLARY EMBODIMENT

The following detailed description of a preferred embodiment is merely exemplary in nature and is not intended to limit the invention or the application and uses of the invention.

Figure 3:
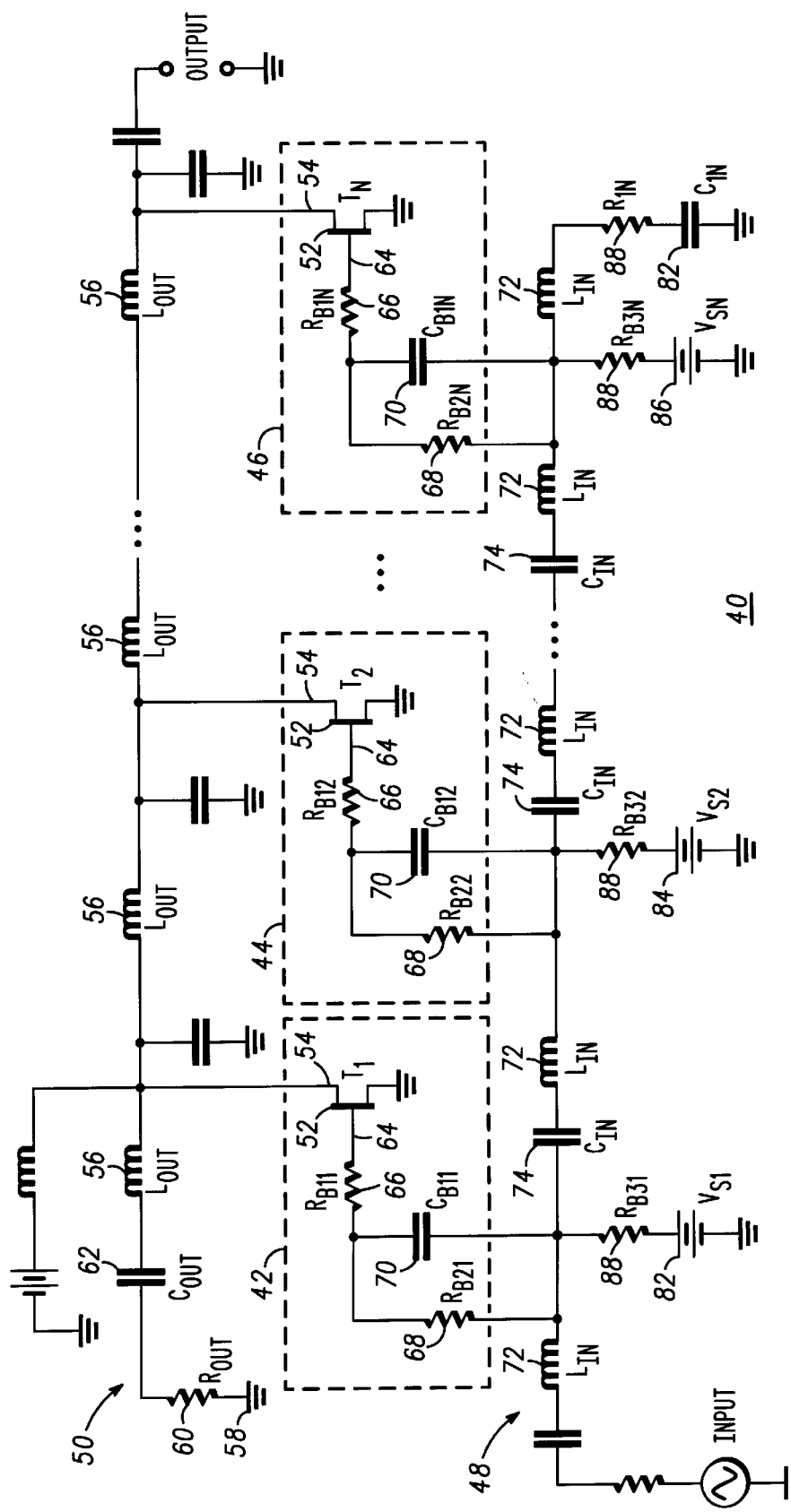
FIG. 3 is a schematic circuit diagram of a distributed amplifier according to a preferred exemplary embodiment of the present invention.

Referring to FIG. 3, a distributed amplifier 40 is illustrated according to a preferred exemplary embodiment of the present invention. The distributed amplifier 40 of the preferred exemplary embodiment has N amplifier cells (42,44, 46) connected to the input transmission line 48 and the output transmission line 50. Preferably, N is greater than one, more preferably greater than three, and most preferably greater than three and less than seven (i.e., N is most preferably four to six). The N amplifier cells (42,44,46) include a first transistor ($T_1, T_2, \ldots, T_N$) 52 connected between the input transmission line 48 and the output transmission line 50. The first transistor 52 is preferably a Junction Field Effect Transistor (JFET), more preferably a High Electron Mobility Transistor (HEMT) and most preferably Pseudomorphic High Electron Mobility Transistor (PHEMT). However, any number of transistors can be used for the first transistor 52 in accordance with the present invention, such as a Bipolar Junction Transistor (BJT) or a Metal-Oxide Semiconductor Field Effect Transistor (MOSFET). Furthermore, while the following detailed description of a preferred exemplary embodiment will describe a single transistor configuration for the N amplifier cells (42,44,46), any number of amplifier cell configurations can be used, including, but not limited to multiple transistors in a cascode configuration.

Figure 4:
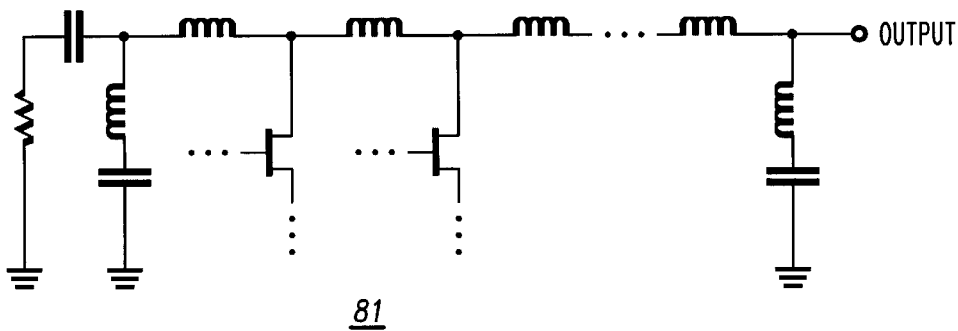
FIG. 4 is a constant-K with M derived half-sections configuration of the input transmission line and/or the output transmission line of FIG. 3.
Figure 5:
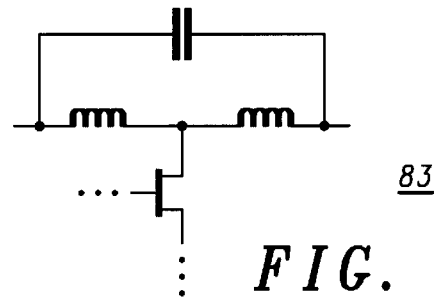
FIG. 5 is a constant-R configuration of the input transmission line and/or the output transmission line of FIG. 3.

The drain terminal 54 of the transistor 52 of the N cells (42,44,46) is coupled with output-line inductances ($L_{out}$) 56, which are connected to an output-line ground 58 with an output-line termination resistance ($R_{out}$) 60 and an output-line capacitance ($C_{out}$) 62. The gate terminal 64 of the transistor 52 of the N cells (42,44,46) is connected to the input transmission line 48 formed of input-line inductances ($L_{in}$) 72 and input-line capacitances ($C_{in}$) 74 that are connected to an input-line ground 76 with an input-line termination resistance ($R_{in}$) 78 and an input-line termination capacitor 80 ($C_{in}$). However, the gate terminal 64 and drain terminal 54 of the transistor 52 of the N cells (42,44,46) can be connected to the input transmission line 48 and output transmission line 50 formed in any number of electrical configurations. For example, a constant-R 83 and/or a constant-K with M-derived half sections 81 can be utilized in accordance with the present invention as shown in FIG. 4 and FIG. 5, respectively.

The gate terminal 64 of the transistor 52 of the N cells (42,44,46) is connected to the input transmission line 48 with a biasing network having a first stability resistor ($R_{B11}$, $R_{B22}$, . . . , $R_{B1N}$) 66 in series with a second biasing resistor ($R_{B21}$, $R_{B21}$, . . . , $R_{B2N}$) 68 in parallel with a first biasing capacitor ($C_{B11}$, $C_{B12}$, . . . , $C_{B1N}$) 70. Each of the biasing networks of the N cells (42,44,46) is connected to independent biasing sources ($V_{S1}, V_{S2}, \ldots, V_{SN}$) (82,84,86) with a third biasing resistor ($R_{B31}$, $R_{B32}$, . . . , $R_{B3N}$) 88. The independent biasing sources ($V_{S1}, V_{S2}, \ldots, V_{SN}$) (82,84,86) corresponding to each of the N cells (42,44,46) is configured to independently and sequentially apply a pinch-off voltage ($V_p$) (i.e., the voltage at which the current flow between the drain and the source is reduced essentially to zero) to each of the transistors 52 such that each of the N cells (42,44,46) is turned off in an order beginning with the $N^{th}$ amplifier cell (46). This independent and sequential biasing of the transistors 52 with the independent biasing sources ($V_S$) (82,84, 86) to turn off each of the N cells (42,44,46) in an order beginning with the Nth amplifier cell (46) lowers the output level while minimizing a degradation in the Power Added Efficiency (PAE) of the distributed amplifier cell 40.

Figure 6:
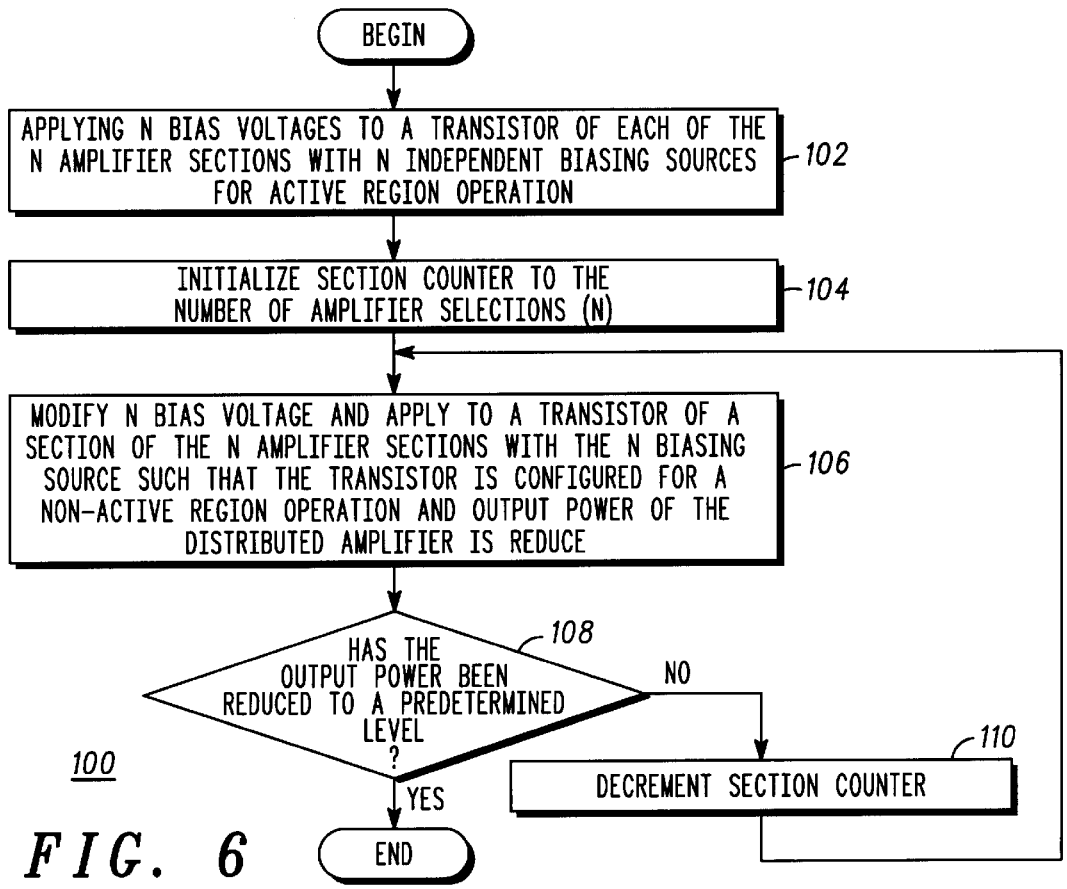
FIG. 6 is a flowchart illustrating a method of operating a distributed amplifier having separately biased amplifier sections according to a preferred exemplary embodiment of the present invention.

More specifically, a method 100 of operating the distributed amplifier of FIG. 3 is illustrated in FIG. 6 according to a preferred exemplary embodiment of the present invention. The method 100 comprises applying N bias voltages to a transistor of each of the N amplifier sections with the N independent biasing sources for active region operation 102 (i.e., the transistor is biased for use as an amplifier). Once each of the transistors of each of the N amplifier sections are applied with the N bias voltages for active region operation 102, a section counter is initialized to the number of amplifier sections or cells (N) 104. Once the section counter is initialized 104, a first bias voltage of the N bias voltages is modified and applied to a first transistor of a first section of the N amplifier sections with a first biasing source of the N biasing sources, beginning with the amplifier section corresponding to the output of the distributed amplifier, such that the first section of the N amplifier sections is configured for a non-active operating region (i.e., which is also referred to as the nonsaturated region, triode region, or ohmic region, and the transistor is not biased for use as an amplifier) and the output power of the distributed amplifier is reduced without substantial degradation in the PAE of the distributed amplifier 106. For example and with reference to FIG. 3, a first bias voltage is modified and applied to the transistor 52 of the Nth cell 46 with the Nth independent biasing source (VSN) 86, such that the Nth section 46 of the N amplifier sections is configured for a non-active operating region and the output power of the distributed amplifier 40 is reduced without substantial degradation in the PAE of the distributed amplifier 40.

Once a first bias voltage of the N bias voltages is modified and applied to a first transistor of a first section of the N amplifier sections with a first biasing source of the N biasing sources, beginning with the amplifier section corresponding to the output of the distributed amplifier, such that the first section of the N amplifier sections is configured for a non-active operating region and the output power of the distributed amplifier is reduced without substantial degradation in the PAE of the distributed amplifier 106, a query is made to determine whether the output power has been reduced to a predetermined level 108.

Figure 7:
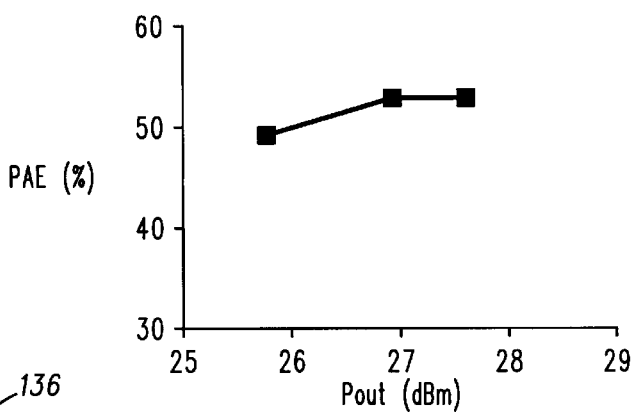
FIG. 7 is a graph illustrating the PAE as a function of the output power for the distributed amplifier of FIG. 3 that is operated according to the method of FIG. 6 in accordance with a preferred exemplary embodiment of the present invention.

If the output power has not been reduced to a predetermined level, the section counter is decremented and a second bias voltage of the N bias voltages is modified and applied to a second transistor of a second section of the N amplifier sections with a second biasing source of the N biasing sources, which is preferably the N−1 amplifier section, such that the second section of the N amplifier sections is configured for a non-active operating region in addition to the first section and the output power of the distributed amplifier is reduced without substantial degradation in the PAE of the distributed amplifier 106. This continues until the output power has been reduced to a predetermined level, with a reduction in the output power of the distributed amplifier configured to be inversely proportional to the N. The substantial degradation in PAE of the distributed amplifier is less than about a twenty percent, more preferably less than about a fifteen percent, even more preferably less than a ten percent, and most preferably less than about a five percent reduction in the PAE from the maximum PAE corresponding to the maximum output power. An example of PAE degradation as a function of the output power ($P_{out}$) is shown in FIG. 7 for the distributed amplifier 40 of FIG. 3 that is operated according to the method 100 of FIG. 6 in accordance with a preferred exemplary embodiment of the present invention.

The distributed amplifier of the present invention is preferably designed to operate at frequencies below about twenty GHz, more preferably below about ten GHz, even more preferably to operate at frequencies below about five GHz and most preferably to operate at frequencies below about two GHz. Therefore, the distributed amplifier of the present invention is preferably fabricated as a multi-layer ceramic device and more preferably as Low Temperature Co-fired Ceramic (LTCC), since the multi-layer ceramic structure enables the realization of circuit elements in a relatively small space, including vertically wound high Q inductors. In addition, the multi-layer ceramic structure for the distributed amplifier minimizes interconnection parasitic reactance between active and passive circuit elements and provides thermal vias for removal of excess heat generated by the distributed amplifier.

Figure 8:
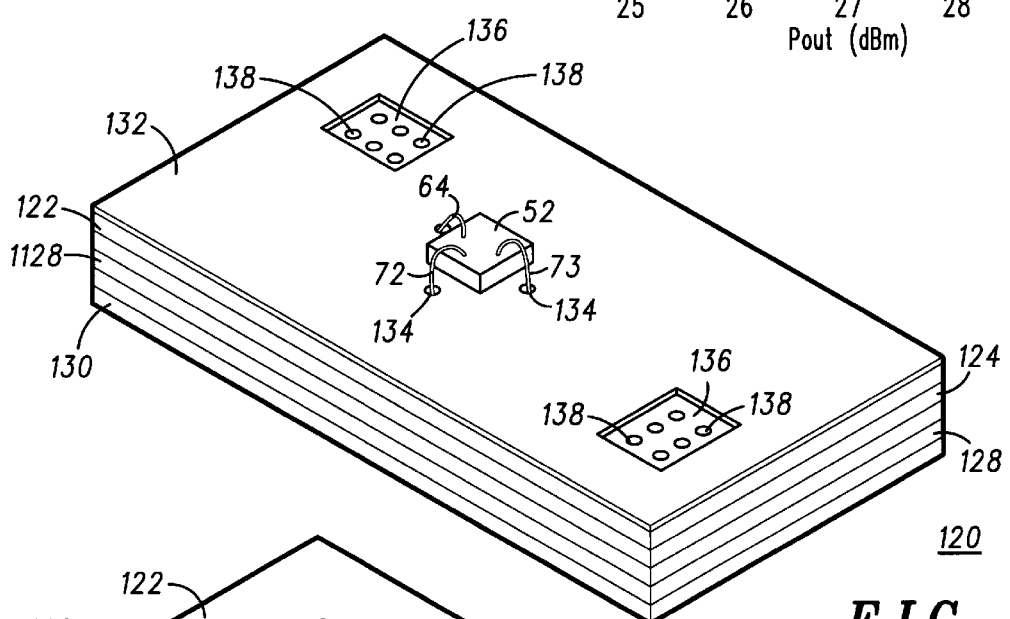
FIG. 8 is a multi-layer ceramic package of one of the distributed amplifier sections of FIG. 3 according to a preferred exemplary embodiment of the present invention.

Referring to FIG. 8, a multi-layer ceramic (MLC) structure 120 for the distributed amplifier cell 42 (i.e., a MLC distributed amplifier cell) of FIG. 3 is shown according to a preferred exemplary embodiment of the present invention. Preferably, the MLC structure 120 is a LTCC. The MLC structure 120 is comprised of multiple ceramic layers (122, 124,126,128,130) connected to the transistor 52. The transistor 52 is preferably mounted to the surface 132 of the multiple ceramic layers (122,124,126,128,130) with any number of surface mounting techniques and electrically connected to electrical components formed within one or more of the ceramic layers (122,124,126,128,130) with multiple through-holes 134, which are referred to herein as vias, in one or more of the ceramic layers (122,124,126, 128,130). In addition, the MLC structure 120 is preferably formed with at least one cavity 136 or more than one cavities 136 with at least one and more preferably multiple thermal vias 138 that are configured to remove excess thermal energy generated by the electrical components embedded in the multiple ceramic layers (122,124,126,128,130). These thermal vias 138 are preferably placed underneath an active component for heat dissipation.

Figure 9:
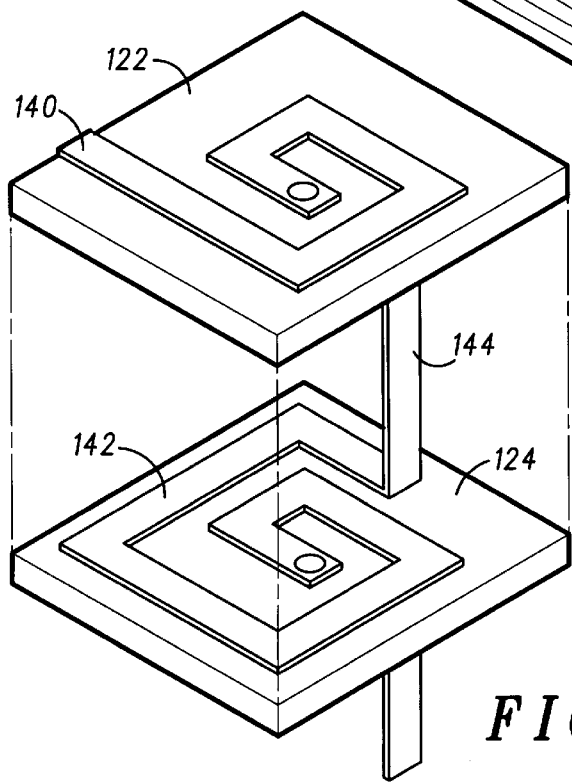
FIG. 9 is an inductor embedded within multiple ceramic layers of the multi-layer ceramic package of FIG. 8 according to a preferred exemplary embodiment of the present invention.

According to a preferred exemplary embodiment of the present invention, the transistor 52 is connected to the input transmission line having the input line inductor embedded within the first ceramic layer 122 and the second ceramic layer 124 as shown in FIG. 9. Referring to FIG. 9, the first portion 140 of the input line inductor is connected to the second portion 142 of the input line inductor with an input line via 144. The dimensions of the traces within the first ceramic layer 122 and the second ceramic layer 124 provides the value of the input line inductor. As can be appreciated, this provides a vertically wound inductor with a high Q in a relatively small space.

Figure 1:
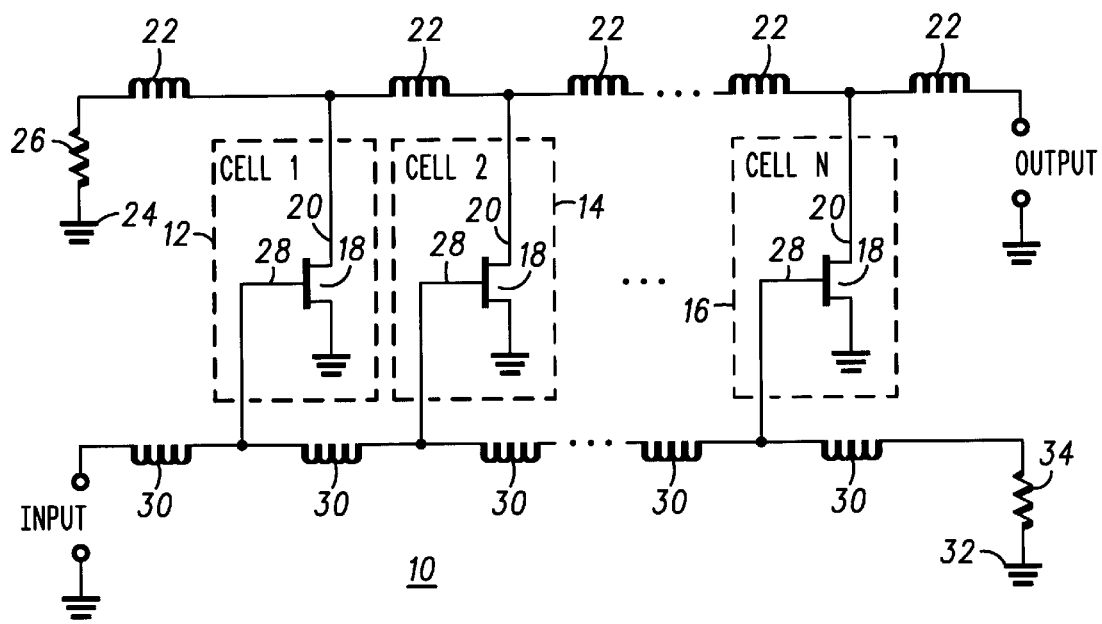
FIG. 1 is a schematic circuit diagram of a distributed amplifier according to the prior art.
Figure 2:
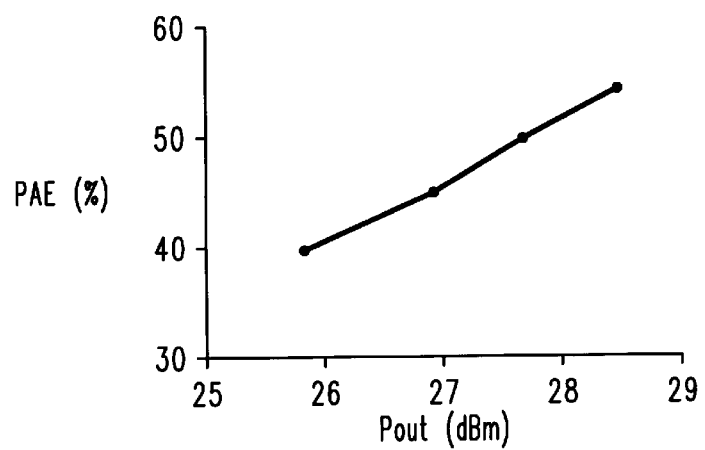
FIG. 2 is a graph illustrating the Power-Added Efficiency (PAE) degradation as a function of the output power (Pout) for a distributed amplifier of the prior art.

The second transistor 54 is connected to the input transmission line having the input line inductor embedded within one or more of the ceramic layers (122,124,126,128,130) as discussed with reference to FIG. 9. In addition, the capacitors of the distributed amplifier 40 of FIG. 3 are preferably formed in a manner that is similar to the input line inductor and the output line inductor by locating a first parallel plate in one of the ceramic layers and a second parallel plate in one of the other ceramic layers adjacent to the first parallel plate, which are separated by another one of the ceramic layers. For example, the first parallel plate of a capacitor can be embedded in the second ceramic layer 124 adjacent to the second parallel plate embedded in the fourth ceramic layer 128 and separated by the third ceramic layer 126. The dielectric constant of the ceramic layers and the dimensions of the parallel plates can be adjusted to provide the value of the capacitor. Furthermore, any number of strip line components or microstrip components can be embedded into one or more of the ceramic layers to form the amplifier section 42 illustrated in FIG. 3 and the distributed amplifier 40 shown in FIG. 2, including, but not limited to resistors.

As can be appreciated by one of ordinary skill in the art, the distributed amplifier 40 of FIG. 3 that is configured with the electrical components embedded in the multiple ceramic layers (122,124,126,128,130) of the MLC structure 130 as previously described with reference to FIGS. 8 and 9 provides a distributed amplifier that is designed for frequencies below about twenty GHz, more preferably below about ten GHz, even more preferably below 5 GHz and most preferably below 2 GHz in a cost effect manner. Furthermore, the MLC structure 120 of FIGS. 8 and 9 provides a configuration for the removal of excess thermal energy with thermal vias in one or more of the ceramic layers (122,124,126,128, 130). In addition, interconnection parasitic reactance between active and passive components is minimized with the MLC structure 120 of FIGS. 8 and 9.

From the foregoing description, it should be appreciated that a distributed amplifier is provided that presents significant benefits that have been presented in the background of the invention and detailed description of a preferred exemplary embodiment and also presents significant benefits that would be apparent to one skilled in the art. Furthermore, while a preferred exemplary embodiment has been presented in the foregoing description of a preferred exemplary embodiment, it should be appreciated that a vast number of variations in the embodiments exist. Lastly, it should be appreciated that these embodiments are preferred exemplary embodiments only, and are not intended to limit the scope, applicability, or configuration of the invention in any way. Rather, the foregoing detailed description provides those skilled in the art with a convenient road map for implementing a preferred exemplary embodiment of the invention. It being understood that various changes may be made in the function and arrangement of elements described in the exemplary preferred embodiment without departing from the spirit and scope of the invention as set forth in the appended claims.

What is claimed is:

1. A method of operating a distributed amplifier having a N amplifier sections connected to an input transmission line and an output transmission line and separately biased with N independent biasing sources, comprising:

applying N bias voltages to a transistor of each of the N amplifier sections with the N independent biasing sources for active region operation of said transistor; and modifying a first bias voltage of said N bias voltages applied to a first transistor of a first section of the N amplifier sections with a first independent biasing source of said N independent biasing sources such that said first transistor of said first section of the N amplifier sections is configured for a non-active region operation and an output power of said distributed amplifier is reduced without a substantial degradation in an efficiency of the distributed amplifier.

2. The method of operating the distributed amplifier of claim 1, further comprising modifying a second bias voltage of said N bias voltages applied to a second transistor of a second section of the N amplifier sections with a second independent biasing source of said N independent biasing sources such that said second transistor of said second section of the N amplifier sections is configured for a non-active region operation and said output power of said distributed amplifier is reduced without said substantial degradation in said efficiency of the distributed amplifier.

3. The method of operating the distributed amplifier of claim 2, further comprising modifying a third bias voltage of said N bias voltages applied to a third transistor of a third section of the N amplifier sections with a third independent biasing source of said N independent biasing sources such that said third transistor of said third section of the N amplifier sections is configured for a non-active region operation and said output power of said distributed amplifier is reduced without said substantial degradation in said efficiency of the distributed amplifier.

4. The method of operating the distributed amplifier of claim 3, further comprising modifying a fourth bias voltage of said N bias voltages applied to a fourth transistor of a fourth section of the N amplifier sections with a fourth independent biasing source of said N independent biasing sources such that said fourth transistor of said fourth section of the N amplifier sections is configured for a non-active region operation and said output power of said distributed amplifier is reduced without said substantial degradation in said efficiency of the distributed amplifier.

5. The method of operating the distributed amplifier of claim 1, wherein said transistor of each of the N amplifier sections is a Junction Field Effect Transistor (FET).

6. The method of operating the distributed amplifier of claim 1, wherein said transistor of each of the N amplifier sections is a pseudomorphic high electron mobility transistor (PHEMT).

7. The method of operating the distributed amplifier of claim 1, wherein N is an integer greater than one.

8. The method of operating the distributed amplifier of claim 1, wherein N is an integer greater than two.

9. The method of operating the distributed amplifier of claim 1, wherein N is an integer greater than three and less than seven.

10. The method of operating the distributed amplifier of claim 1, wherein aid reduction in said output power of said distributed amplifier is inversely proportional to the N.

11. The method of operating the distributed amplifier of claim 1, wherein said substantial degradation in said efficiency of the distributed amplifier is less than about twenty percent.

12. The method of operating the distributed amplifier of claim 1, wherein said substantial degradation in said efficiency of the distributed amplifier is less than about fifteen percent.

13. The method of operating the distributed amplifier of claim 1, wherein said substantial degradation in said efficiency of the distributed amplifier is less than about ten percent.

14. The method of operating the distributed amplifier of claim 1, wherein said substantial degradation in said efficiency of the distributed amplifier is less than about five percent.

15. A distributed amplifier, comprising:
an input transmission line;
an output transmission line;
N amplifier sections having a transistor connected to said input transmission line and said output transmission line;
N independent biasing sources configured to provide N independent biasing voltages for each transistor of said N amplifier sections for active operation,
wherein the distributed amplifier is configured such that when a first independent biasing voltage of said N independent biasing voltages is modified for a first transistor of a first section of said N amplifier sections, said first transistor of said first section of said N amplifier sections is configured for a non-active operation and an output power of said distributed amplifier is reduced without a substantial degradation in an efficiency of the distributed amplifier.

16. The distributed amplifier of claim 15, wherein the distributed amplifier is configured such that when a second independent biasing voltage of said N independent biasing voltages is modified for a second transistor of a second section of said N amplifier sections, said second transistor of said second section of said N amplifier sections is configured for said non-active operation and said output power of the distributed amplifier is reduced without a substantial degradation in an efficiency of the distributed amplifier.

17. The distributed amplifier of claim 16, wherein the distributed amplifier is configured such that when a third independent biasing voltage of said N independent biasing voltages is modified for a third transistor of a third section of said N amplifier sections, said third transistor of said third section of said N amplifier sections is configured for said non-active operation and said output power of the distributed amplifier is reduced without a substantial degradation in an efficiency of the distributed amplifier.

18. The distributed amplifier of claim 17, wherein the distributed amplifier is configured such that when a fourth independent biasing voltage of said N independent biasing voltages is modified for a fourth transistor of a fourth section of said N amplifier sections, said fourth transistor of said fourth section of said N amplifier sections is configured for said non-active operation and said output power of the distributed amplifier is reduced without a substantial degradation in an efficiency of the distributed amplifier.

19. The distributed amplifier of claim 15, wherein said transistor of each of the N amplifier sections is a Junction Field Effect Transistor (FET).

20. The distributed amplifier of claim 15, wherein said transistor of each of the N amplifier sections is a pseudomorphic high electron mobility transistor (PHEMT).

21. The distributed amplifier of claim 15, wherein N is an integer greater than one.

22. The distributed amplifier of claim 15, wherein N is an integer greater than two.

23. The distributed amplifier of claim 15, wherein N is an integer greater than three and less than seven.

24. The distributed amplifier of claim 15, further comprising a plurality of ceramic layers connected to the each transistor of said N amplifier sections, said plurality of ceramic layers comprising a plurality of electrical components of the distributed amplifier that are formed as an integral part of one or more of said plurality of ceramic layers.

25. The distributed amplifier of claim 24, wherein said plurality of ceramic layers is a plurality of Low Temperature Co-fired Ceramic layers (LTCC).

26. The distributed amplifier of claim 24, wherein the distributed amplifier is configured to operate at frequencies below about twenty GHz.

27. The distributed amplifier of claim 24, wherein the distributed amplifier is configured to operate at frequencies below about ten GHz.

28. The distributed amplifier of claim 24, wherein the distributed amplifier is configured to operate at frequencies below about five GHz.

29. The distributed amplifier of claim 24, wherein the distributed amplifier is configured to operate at frequencies below about two GHz.

30. The distributed amplifier of claim 15, wherein said reduction in said output power of said distributed amplifier is inversely proportional to the N.

31. The distributed amplifier of claim 15, wherein said substantial degradation in said efficiency of the distributed amplifier is less than about twenty percent.

32. The distributed amplifier of claim 15, wherein said substantial degradation in said efficiency of the distributed amplifier is less than about fifteen percent.

33. The distributed amplifier of claim 15, wherein said substantial degradation in said efficiency of the distributed amplifier is less than about ten percent.

34. The distributed amplifier of claim 15, wherein said substantial degradation in said efficiency of the distributed amplifier is less than about five percent.

* * * * *